United States Patent
Gharpurey

(10) Patent No.: US 6,980,055 B2
(45) Date of Patent: Dec. 27, 2005

(54) CMOS DIFFERENTIAL BUFFER CIRCUIT

(75) Inventor: Ranjit Gharpurey, Ann Arbor, MI (US)

(73) Assignee: Texas Instruments Incorporated, Dallas, TX (US)

(*) Notice: Subject to any disclaimer, the term of this patent is extended or adjusted under 35 U.S.C. 154(b) by 89 days.

(21) Appl. No.: 10/744,682

(22) Filed: Dec. 23, 2003

(65) Prior Publication Data

US 2005/0035819 A1 Feb. 17, 2005

Related U.S. Application Data

(60) Provisional application No. 60/494,174, filed on Aug. 11, 2003.

(51) Int. Cl.[7] .............................. H03F 3/45; H03F 1/14
(52) U.S. Cl. ...................................... 330/257; 330/292
(58) Field of Search ................................ 330/253, 257, 330/260, 261, 292

(56) References Cited

U.S. PATENT DOCUMENTS

| | | |
|---|---|---|
| 5,850,163 A | 12/1998 | Drost et al. |
| 5,874,840 A * | 2/1999 | Bonaccio ............. 327/55 |
| 6,278,336 B1 | 8/2001 | Tinsley et al. |
| 6,542,031 B2 | 4/2003 | Kwong |
| 2002/0101285 A1 | 8/2002 | Chatwin |

OTHER PUBLICATIONS

"A 900 MHz CMOS RF Power Amplifier with Programmable Output", M. Rofougaran, A. Rofougaran, C. Olgaard and A. A. Abidi, 1994 Symposium on VLSI Circuits Digest of Technical Papers, IEEE, Apr. 1994, pp. 133-134.

* cited by examiner

Primary Examiner—Steven J. Mottola
(74) Attorney, Agent, or Firm—William B. Kempler; W. James Brady, III; Frederick J. Telecky, Jr.

(57) ABSTRACT

The present invention pertains to a MOS type differential buffer circuit. The buffer proposed herein utilizes capacitive coupling to apply small AC signals to an amplifying current source to mitigate attenuation owing to body effect and output impedance, among other things, in an associated follower component. The proposed circuit does not, however, promote an increase in current and/or power dissipation. Additionally, the circuit allows a desired gain to be achieved while maintaining a relatively constant output impedance, compared to a simple differential source follower.

19 Claims, 3 Drawing Sheets

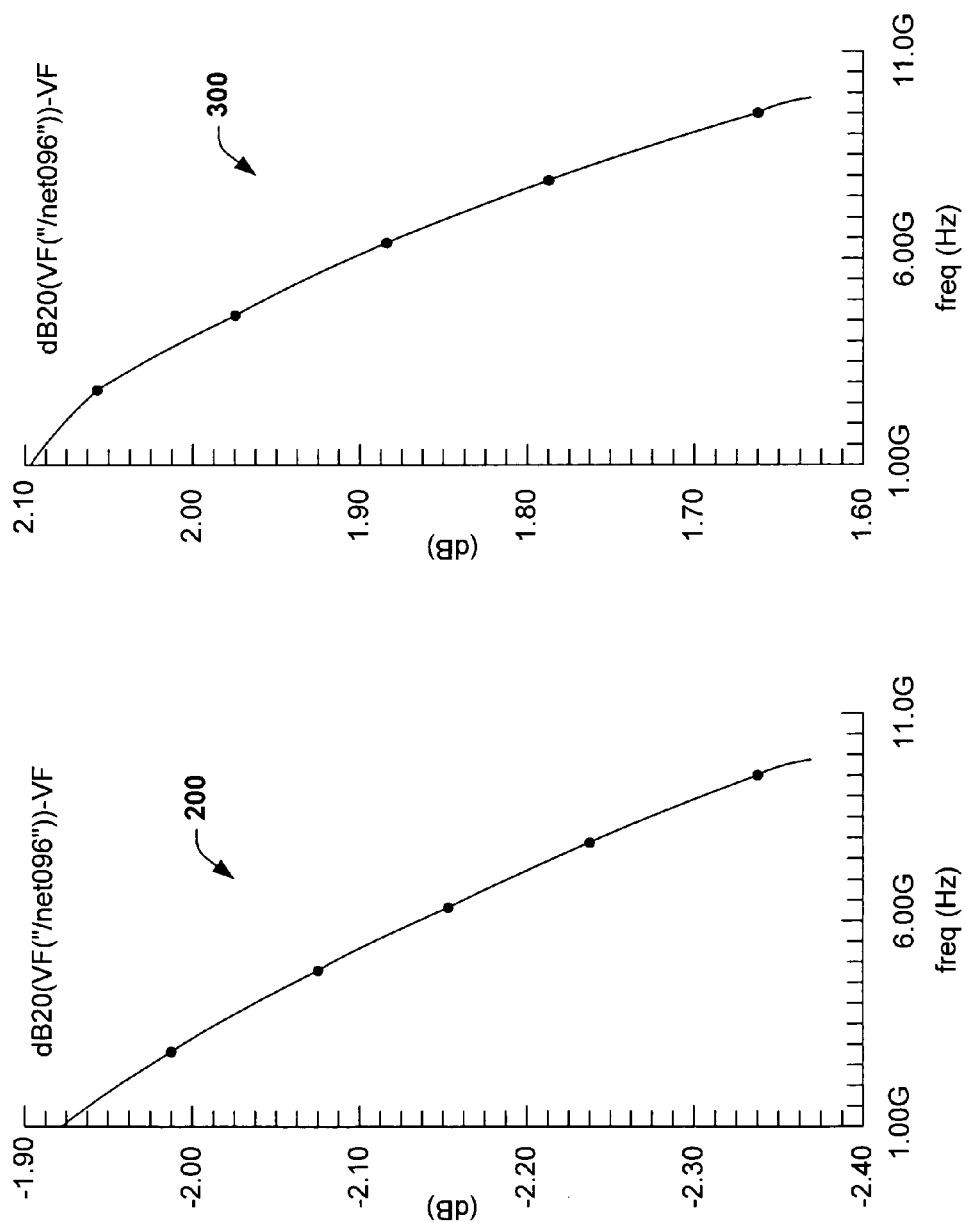

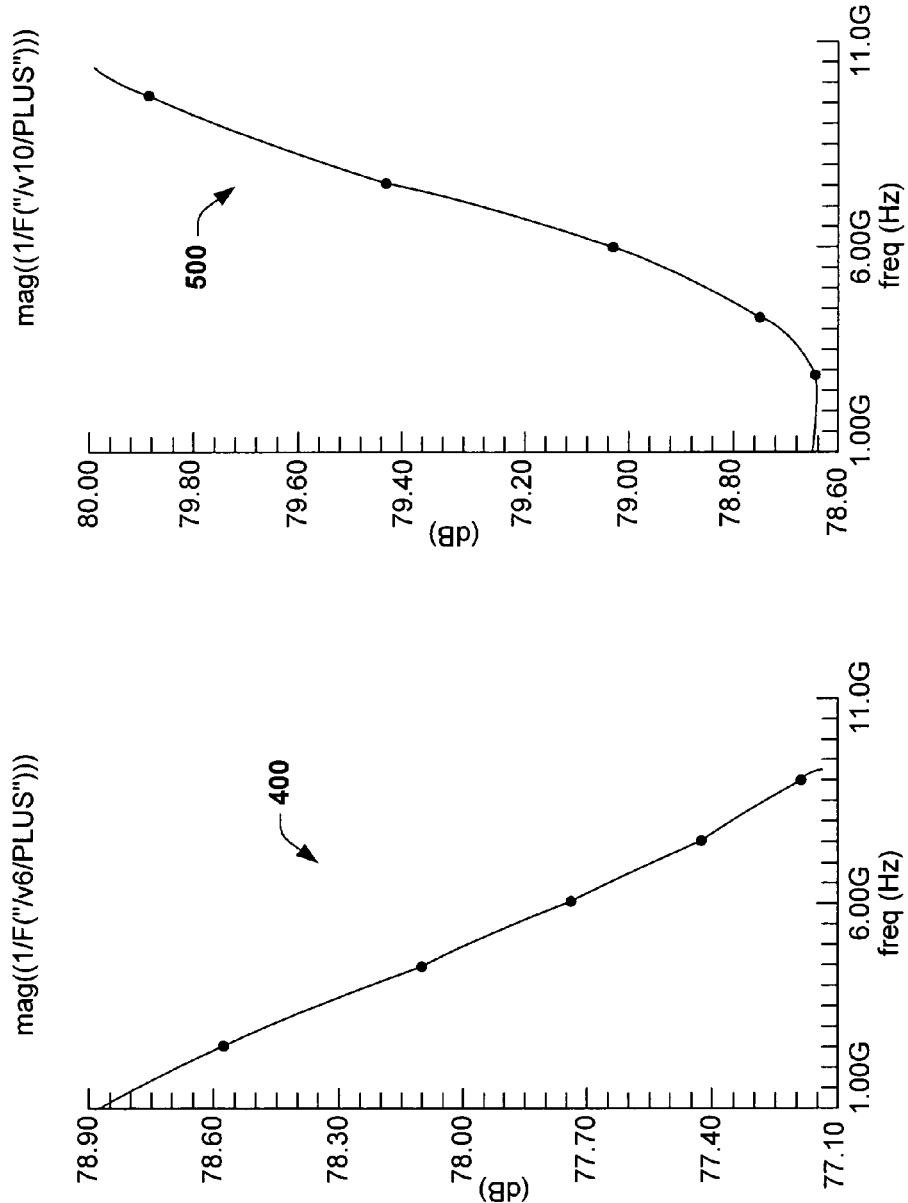

CMOS DIFFERENTIAL BUFFER CIRCUIT

RELATED APPLICATION

This application claims priority to provisional application Ser. No. 60/494,174 filed Aug. 11, 2003, which is entitled "CMOS Differential Buffer Circuit".

FIELD OF INVENTION

The present invention relates generally to buffer circuits, and more particularly to a CMOS differential buffer circuit wherein signal attenuation is mitigated via small signal AC capacitive coupling.

BACKGROUND OF THE INVENTION

A source follower is often used as a voltage buffer to drive subsequent circuits with a relatively low source impedance, especially in high-frequency applications. Voltage buffer circuits have a high input impedance and a low output impedance so that they can be utilized to drive subsequent circuits which have lower impedances than that which an input circuit without a buffer can drive. As such, the buffer can be put in-between the load circuits and input circuits so that the buffer feeds required current to the load circuits. However, complimentary metal oxide semiconductor (CMOS) source followers, such as NMOS and/or PMOS source followers, unlike bipolar emitter followers, have significant attenuation owing to body effect and output impedance of the current source, among other things.

Body effect relates to the effect that a substrate and variations therein have on a threshold voltage, among other things, of a CMOS device (e.g., a transistor). Body effect gives rise to attenuation, and for a source follower circuit with an open load, this can be expressed as gm over gm+gmb, where gm is the transconductance of a circuit. Transconductance corresponds to the ratio between an output current and an input voltage. If an input voltage alternates by one milli-volt, for example, then an output voltage is given by gm over gm+gmb times a milli-volt, due to which the output voltage will be less than a milli-volt.

Additionally, in short-channel CMOS followers, the impedance of the current sources can be relatively small, and the gain of the differential follower is thereby further degraded. If used as a driver to a matched load, for example, there can be an inherent voltage attenuation of 6 dB or more. Similarly, if a CMOS source follower is used to drive an external load (e.g., a 50 ohm load), then considerable attenuation may be experienced in the signal. The above impairments related to CMOS buffer implementations further increase the attenuation. Despite these problems, source followers are widely used as buffers, especially were OP-AMP or feedback amplifier based techniques cannot be employed due to their inadequate frequency response performance.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to a MOS type differential buffer circuit. The buffer proposed herein avoids problems associated with attenuation owing to body effect and output impedance, among other things, while not promoting an increase in current dissipation. Signal loss inherent to matching the output impedance to a load is also avoided. Capacitive coupling is implemented in the circuit to apply small AC signals to an amplifying current source to mitigate attenuation in an associated follower component.

According to one or more aspects of the present invention, a MOS type differential buffer circuit is disclosed. The circuit includes a current mirror and amplifier current sources operatively coupled to the current mirror to receive a bias voltage from the current mirror. The circuit also has first and second input bias circuits and first and second differential input nodes. A differential source follower is also included and is operatively coupled to the first and second input bias circuits and the first and second differential input nodes to respectively receive bias signals and small AC signals there-from. Finally, the circuit includes a small signal passage component coupled between the first and second differential input nodes and the amplifier current sources in a cross-coupled fashion. The small signal passage component allows the respective small AC signals to pass there-through and be applied to the amplifier current source. The amplifier current source is also operatively coupled to the source follower to provide current thereto, the small AC signals applied to the amplifier current source serve to mitigate attenuation experienced in the source follower.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings

BRIEF DESCRIPTION OF THE DRAWINGS

FIG. 2 is a graphical depiction illustrating the gain of a source follower that lacks capacitive coupling and resulting mitigation of attenuation as provided by a circuit disclosed herein.

FIG. 3 is a graphical depiction illustrating the gain of a differential buffer that utilizes capacitive coupling and AC small signal compensation to mitigate signal attenuation in accordance with one or more aspects of the present invention.

FIG. 4 is a graphical depiction illustrating the impedance of a source follower that lacks capacitive coupling and resulting mitigation of attenuation as provided by a circuit disclosed herein.

FIG. 5 is a graphical depiction illustrating the impedance of a differential buffer that utilizes capacitive coupling and AC small signal compensation to mitigate signal attenuation according to one or more aspects of the present invention.

DETAILED DESCRIPTION OF THE INVENTION

Figure 1:
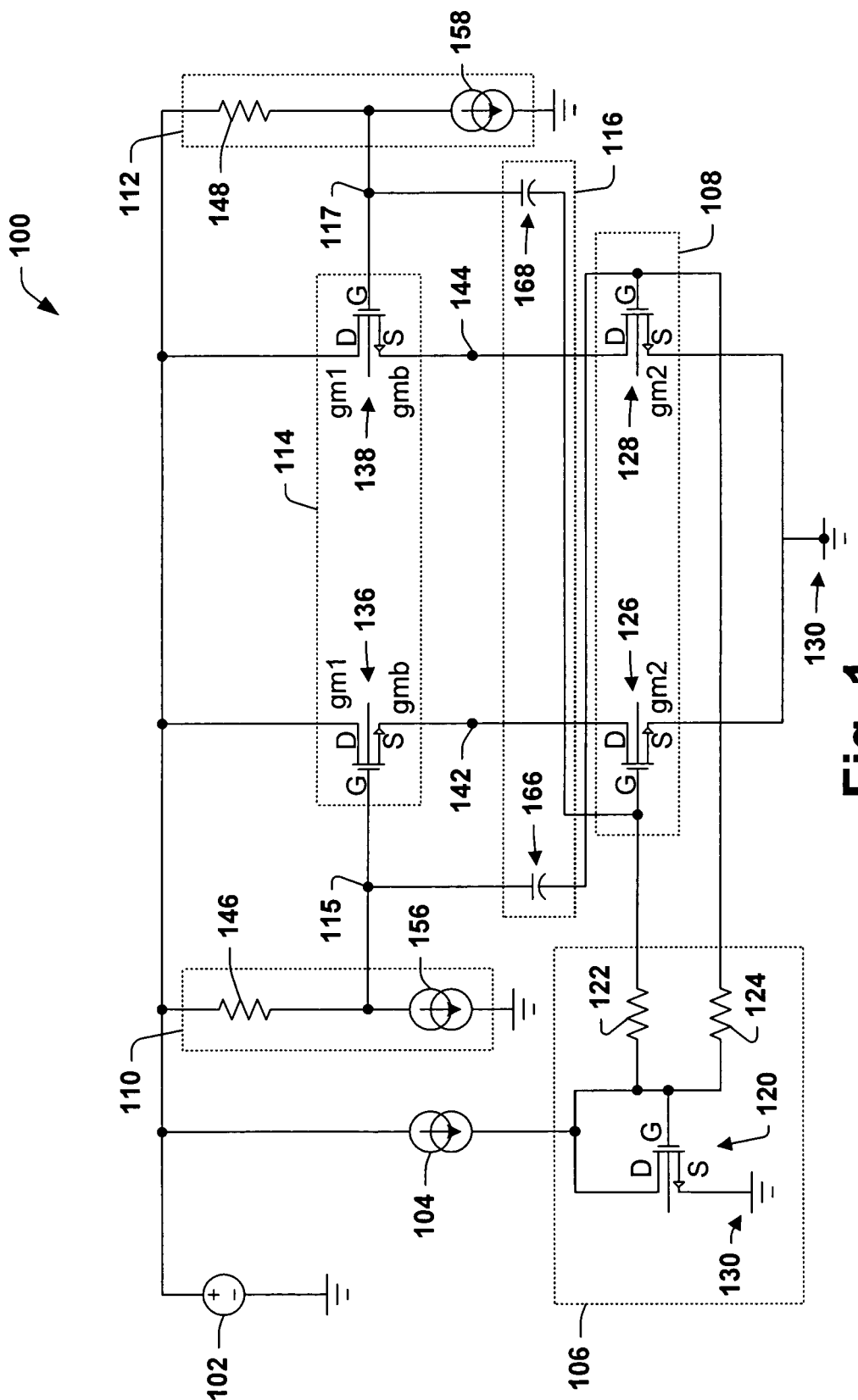
FIG. 1 is a circuit diagram illustrating a MOS type differential buffer circuit implemented in accordance with one or more aspects of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, well-known structures and devices are shown in block diagram form in order to facilitate describing one or more aspects of the present invention.

The present invention pertains to a MOS type differential buffer circuit. The buffer proposed herein utilizes capacitive coupling to apply small AC signals to an amplifying current source to mitigate attenuation owing to body effect and output impedance, among other things, in an associated follower component and where relevant, to avoid the attenuation inherent to a matched impedance operation of the buffer. The proposed circuit does not, however, promote an increase in current and/or power dissipation. Additionally, the circuit allows a desired gain to be achieved while maintaining a relatively constant output impedance, that is not different to the first order from the impedance presented by a simple differential source follower circuit.

FIG. 1 is a circuit diagram illustrating a differential buffer circuit 100 as proposed herein. The circuit includes a DC source 102, such as a power supply or battery, and a reference current source 104 for supplying the system 100. The current source 104 feeds into a current mirror 106, which is operatively coupled to an amplifier current source 108. First and second input bias circuits 110, 112 are also included to bias a source follower 114. It is to be appreciated that while the source follower 114 is depicted as being an NMOS follower in the exemplary circuit illustrated, the present invention is not intended to be limited to such an embodiment. Similarly, the circuit 100 has first and second differential input nodes 115, 117 to receive small AC signals (e.g., IN+, IN−). A small signal passage component 116 is interposed between the differential input nodes 115, 117 and the amplifier current source 108 to (cross) couple the small AC signals to the amplifier current source 108.

Further, in the present example the current mirror 106 includes a diode connected transistor 120 and two resistors 122, 124 connected to the gate of that transistor 120. Resistor 122 of the current mirror 106 is also coupled to a first transistor 126 of the amplifier current source 108, and more particularly to the gate of that transistor 126. Similarly, resistor 124 of the current mirror 106 is also operatively coupled to the gate of a second transistor 128 of the amplifier current source 108. In this manner, a gate bias is provided to the transistors 126, 128 to set those transistors. The current mirror 106 may, for example, have a DC current of 1 milli-amp. flowing through it. The source of transistor 126 and the source of transistor 128 are coupled to one another and tied to ground 130.

The source follower 114 also includes two transistors 136, 138. The drain of transistor 126 is coupled to the source of transistor 136, and the drain of transistor 128 is coupled to the source of transistor 138. Differential outputs 142, 144 of the circuit 100 exist between the drain and source of transistors 126 and 136, and the drain and source of transistors 128 and 138, respectively. The drain of transistor 136 and the drain of transistor 138 are coupled back to the DC source 102. As will be discussed further, the gate of transistor 136 is operatively coupled to the first differential input node 115 and the first input bias circuit 110 and the gate of transistor 138 is operatively coupled to the second differential input node 117 and the second input bias circuit 112.

The first and second input bias circuits 110, 112 include respective resistors 146, 148 and current sources 156, 158. As such, the first and second input bias circuits 110, 112 provide bias signals to the gates of transistors 136, 138, respectively. The small signal passage component 116 includes first and second capacitors 166, 168 that are cross-coupled between the gates of transistors 136, 128, and the gates of transistors 138, 126, respectively. In this manner, the small signals applied to the first and second differential input nodes 115, 117 are also controllably coupled to the gates of transistors 128, 126, respectively. The cross-coupled capacitors 166, 168 allow the AC small signals to drive the respective gates of transistors 128, 126.

It will be appreciated that since the circuit 100 is a differential buffer, the inputs are out of phase (e.g., by about 180 degrees). Accordingly, if a signal of 0 degrees phase, for example, is applied to input node 115 (and thus the gate of transistor 136), then a signal of 180 degrees phase in such an example would be applied to input node 117 (and thus the gate of transistor 138). Likewise, in the same example since the capacitors 166, 168 are cross-coupled, a signal of 180 degrees phase is thereby applied to the gate of transistor 126 and a signal of 0 degrees is applied to the gate of transistor 128. Without the capacitive coupling, the lower devices 126 and 128 of the current source 108, would not receive the differential input signal, in which case the circuit would be a simple differential source follower.

Applying small AC signals to transistors 126, 128 converts said transistors 126 and 128 of the current source 108 into signal transconductors. If the transconductance of the transistors 136 and 138 in the differential follower 114 device is said to be gm1, and that of the transistors 126 and 128 of current source 108 is said to be gm2, and the body effect parameter of the transistors 136 and 138 in the differential follower 114 is gmb, then ignoring the output conductances of the transistors 136 and 138 in the differential follower 114 and transistors 126 and 128 of current source 108, the gain is seen to be:

$$gm1/(gm1+gmb)+gm2/gm1\times(1+gm1/gmb)$$

In a simple differential source follower (not having the cross-coupled capacitors), only the first term is applicable, which resembles an attenuator. For example, if gmb=0.1×gm1, then the first term equals 0.91, which is a 0.8 dB loss. This loss increases if the finite output conductances of the transistors in the current source 108 and the follower device 114 are included. In the buffer circuit 100 proposed herein, however, the addition of the second term can be used to compensate this loss at the expense of no extra current in one example. In fact, the buffer can also be used to provide gain using a desired value of gm2. This circuit 100 is also very useful for driving off-chip matched loads, as an output driver in a low noise amplifier (LNA) designed for an ultra wide band (UWB) and in a signal path in a receiver and transmitter.

With a simple follower, for example, if a load is matched to the impedance of the follower (~1/gm1 single-ended), then ignoring the body effect parameter gmb of the transistors 136 and 138 the gain of the follower with the matched load is ½(gm1(1+gm1/gm1)). With this scheme it is relatively easy to compensate for this loss, however. For example, ignoring gmb, and setting gm2~gm1, with an external load of 1/gm1, the gain is given by:

$$gm1/(1+gm1/gm1)+gm2/(gm1+gm1)=\tfrac{1}{2}+\tfrac{1}{2}=1$$

Thus the inherent loss caused by matching is avoided to achieve a gain of one without changing the bias requirement of the buffer. The output impedance buffer circuit 100 is unchanged to the first order compared to that of a simple differential source follower. The combination of the source follower 114 and the amplifier current source 108 serves to mitigate attenuation that would be present if just a source follower were used, and the static current dissipation and power dissipation remain the same as if just a source follower were used. Similar improvement in gain with a matched output impedance would be observed, even if the body-effect parameter gmb of the transistors 136 and 138 is included in the above expression.

It will be appreciated that the circuit 110 proposed herein uses AC coupling for driving the current source 108. In particular, the cross-coupled AC capacitors create a high-pass filter for driving the current source. The capacitors are open at DC, so there is no signal that flows through the capacitors at DC. This makes the response of the buffer 100 a high-pass response. As such, a high-pass curve or corner can be chosen appropriately based upon desired or intended applications. It will be appreciated that simple modifications can also be made to the circuit 100 using DC level shifters, for example, in which case the circuit 100 can be used as a buffer without high-pass characteristics.

In the absence of the (high pass) capacitors, no signal would be coupled to the gates of transistors 126, 128. In such a configuration these transistors would appear as mere current sources, and the upper devices 136, 138 would look like source followers. Similarly, the resistors 122, 124, are required unlike in a simple differential source follower, since if these were replaced by shorts, the lower ends of the capacitors 166, 168 would be effectively shorted together. For example, a small signal of plus (+) V on the gate of one of the upper transistors 136, 138 and minus (−) V on the gate of the other upper transistor 138, 136 would yield a voltage of zero on a common point between the two capacitors 166, 168, if the resistors 122, 124 were replaced by shorts. Also, it will be appreciated that the current mirror 106 merely sets up a DC bias voltage for transistors 126, 128. Small signals do not originate from the mirror, but rather come from the first and second differential input nodes 115, 117 and reach transistors 128, 126, respectively, through the capacitive couplings provided by capacitors 166, 168, respectively.

Thus, it will be appreciated that, according to one or more aspects of the present invention, in addition to a bias voltage of one volt, for example, being applied to the gates of the lower transistors 126, 128, a one milli-volt sinusoid, for example, could also be applied on top of this one volt bias voltage. In this manner, gm2 would then generate the small signal output current in response to this small signal input voltage of one milli-volt. The voltage at the gates of the lower devices 126, 128 would then include the one volt DC plus the sinusoidal small signal of one milli-volt. The small signal is actually the signal that accounts for the gain to mitigate the attenuation. The DC bias merely sets up the bias state of the circuit, but it has no signal content to it. Because the capacitors 166, 168 appear as small impedances at high frequencies and the resistance appears large relative to the impedances of the capacitors, most of the voltage that is applied to the respective gates of the upper devices 136, 138 also shows up on the gates of the lower devices 126, 128. The capacitors 166, 168 thus become very useful at high frequencies, when the capacitors 166, 168 begin to appear as shorts to the small signals, and the small signals thus start to pass there-through. Amplifying or buffering the small signal serves to mitigate attenuation owing to gmb between the respective voltages that supply the gates of the upper transistors 136, 138 and the voltages that show up at the sources of those upper devices 136, 138. Further, by targeting a particular gm2 (e.g., via transistor sizing of 126 & 128) the gain of the buffer may be tailored for varying applications.

Turning to FIGS. 2 and 3, graphical depictions are presented to illustrate the gain of a differential buffer as proposed herein relative to a follower that lacks capacitive coupling. In particular, the curve 200 in FIG. 2 illustrates the case where a follower lacks capacitive coupling, while the curve 300 in FIG. 3 corresponds to a situation where capacitors are utilized to pass compensating AC signals as set forth herein. Decibels (dB) are plotted on the y-axis, while frequencies in gigahertz (GHz) are set forth on the x-axis in FIGS. 2 and 3. It can be seen that the gain is less than one, and in fact has an attenuation on the order of 1–2 dB, in FIG. 2. In FIG. 3, however, where compensating AC signals are utilized to provide a desired value of gm2, the gain has been increased so as to be greater than one at substantially the same frequencies as those depicted in FIG. 2. The gain is in fact about 2 dB, where dB is a log scale. As such, the gain would be about ten to the power of two divided by twenty ($10^{2/20}$ or $10^{0.1}$) or about one and a quarter (1.25).

FIGS. 4 and 5 similarly illustrate the impedance of a follower that lacks the capacitive coupling set forth herein, and the impedance of a differential buffer that utilizes small signal AC compensation as provided herein. It can be appreciated that a differential buffer circuit constructed as provided herein has an output impedance, as seen looking into that stage, which remains unchanged to the first order in comparison to a simple follower circuit, which in the specific example shown in FIGS. 4 and 5 was nominally 78 Ω.

In summary, according to one or more aspects of the present invention, an AC signal of opposite polarity is applied in a current source used in a follower circuit. More particularly, differentially driven source followers are utilized, but a signal is applied on both current sources, thus converting the current sources into transconductance amplifiers, which provide additional gain without increasing overall DC current requirements. The gain is thus increased without an increase in bias current, and the output impedance stays at a controlled and unchanged value. This serves to mitigate attenuation that is inherent in the follower. Further, this is effective to mitigate attenuation even where there's no external load coupled to the follower circuit.

It is to be appreciated that the elements depicted and described herein in association with the accompanying figures and drawings are depicted with particular dimensions relative to one another for demonstrative purposes and simplicity and ease of understanding, and that they may not be drawn to scale and that the actual dimensions of the elements may differ substantially from that shown and described herein. Also, reference to the term exemplary herein is not meant to mean the best or pinnacle, but rather merely an example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A MOS type differential buffer circuit, comprising:
   a current mirror;
   an amplifier current source operatively coupled to the current mirror to receive a bias voltage there-from;
   first and second input bias circuits;
   first and second differential input nodes;
   a source follower operatively coupled to the first and second input bias circuits and the first and second differential input nodes to respectively receive bias signals and small AC signals there-from; and
   small signal passage components coupled between the first and second differential input nodes and the amplifier current source, the small signal passage components allowing the respective small AC signals to pass there-through and be applied to the amplifier current source, the amplifier current source being operatively coupled to the source follower to provide current thereto, the small AC signals applied to the amplifier current source serving to mitigate attenuation experienced in the source follower.

2. The circuit of claim 1, wherein the amplifier current source comprises:
   a first amplifier transistor having a gate that is operatively coupled to the current mirror; and
   a second amplifier transistor having a gate that is operatively coupled to the current mirror.

3. The circuit of claim 2, wherein the source follower comprises:
   a first follower transistor having a gate operatively coupled to the first input bias circuit and the first differential input node; and
   a second follower transistor having a gate operatively coupled to the second input bias circuit and the second differential input node.

4. The circuit of claim 3, wherein the small signal passage component comprises:
   a first capacitor operatively coupled between the gate of the first follower transistor and the gate of the second amplifier current source transistor; and
   a second capacitor operatively coupled between the gate of the second follower transistor and the gate of the first amplifier current source transistor.

5. The circuit of claim 4, wherein the current mirror comprises:
   a diode connected transistor having a gate coupled to first and second mirror resistors, the first mirror resistor being connected to the gate of the first amplifier current source transistor, and the second mirror resistor being connected to the gate of the second amplifier current source transistor.

6. The circuit of claim 5, wherein a source of the first amplifier current source transistor and a source of the second amplifier current source transistor are coupled to one another and tied to ground.

7. The circuit of claim 6, wherein a drain of the first amplifier current source transistor is coupled to a source of the first source-follower transistor.

8. The circuit of claim 7, wherein a drain of the second amplifier current source transistor is coupled to a source of the second source-follower transistor.

9. The circuit of claim 8, wherein a drain of the first source-follower transistor and a drain of the second source-follower transistor are coupled to a DC supply.

10. The circuit of claim 9, wherein a drain of the diode-connected transistor is connected to a reference current supply and back to the gate of the diode connected transistor.

11. The circuit of claim 10, wherein a source of the diode-connected transistor is tied to ground.

12. The circuit of claim 11, wherein the first input bias circuit comprises:
    a first bias circuit resistor; and
    a first bias circuit current source connected in series with the first bias circuit resistor.

13. The circuit of claim 12, wherein the second input bias circuit comprises:
    a second bias circuit resistor; and
    a second bias circuit current source connected in series with the second bias circuit resistor.

14. The circuit of claim 13, wherein the gate of the first follower transistor and the first capacitor are coupled to a point between the first bias circuit resistor and the first bias circuit current source, at the gate of the first bias circuit current source transistor.

15. The circuit of claim 14, wherein the gate of the second follower transistor and the second capacitor are coupled to a point between the second bias circuit resistor and the second bias circuit current source, at the gate of the first bias circuit current source transistor.

16. The circuit of claim 15, wherein the first bias circuit resistor and the second bias circuit resistor are operatively coupled to the DC supply.

17. The circuit of claim 16, wherein the current mirror applies a DC bias to the respective gates of the first and second amplifier transistors, and a small-signal voltage is also applied to the respective gates of the first and second amplifier transistors by virtue of capacitive coupling from the first and second differential input nodes through the first and second capacitors, the small signals added to the amplifying current source serving to mitigate attenuation experienced in the source follower.

18. The circuit of claim 16, wherein signals applied to the first differential input node are approximately 180 degrees out of phase with signals applied to the second differential input node such that AC signals received at the respective gates of the first follower transistor and the second amplifier transistor are approximately 180 degrees out of phase with AC signals received at the respective gates of the second follower transistor and the first amplifier transistor.

19. The circuit of claim 1 providing a gain of more than one.

* * * * *